(12) United States Patent
Aga et al.

(10) Patent No.: US 11,032,955 B2
(45) Date of Patent: Jun. 8, 2021

(54) FERRITE POWDER, RESIN COMPOSITION, ELECTROMAGNETIC SHIELDING MATERIAL, ELECTRONIC CIRCUIT SUBSTRATE, ELECTRONIC CIRCUIT COMPONENT, AND ELECTRONIC DEVICE HOUSING

(71) Applicant: POWDERTECH CO., LTD., Chiba (JP)

(72) Inventors: Koji Aga, Chiba (JP); Tetsuya Igarashi, Chiba (JP)

(73) Assignee: POWDERTECH CO., LTD., Chiba (JP)

( * ) Notice: Subject to any disclaimer, the term of this patent is extended or adjusted under 35 U.S.C. 154(b) by 0 days.

(21) Appl. No.: 16/094,081

(22) PCT Filed: Apr. 5, 2017

(86) PCT No.: PCT/JP2017/014263
§ 371 (c)(1),
(2) Date: Oct. 16, 2018

(87) PCT Pub. No.: WO2017/191725
PCT Pub. Date: Nov. 9, 2017

(65) Prior Publication Data
US 2019/0343027 A1 Nov. 7, 2019

(30) Foreign Application Priority Data
May 2, 2016 (JP) .............................. JP2016-092549

(51) Int. Cl.
*H05K 9/00* (2006.01)
*C01G 53/00* (2006.01)
(Continued)

(52) U.S. Cl.
CPC .......... *H05K 9/0081* (2013.01); *C01G 53/40* (2013.01); *C08K 3/22* (2013.01); *H01F 1/344* (2013.01);
(Continued)

(58) Field of Classification Search
None
See application file for complete search history.

(56) References Cited

U.S. PATENT DOCUMENTS 5,525,404 A * 6/1996 Hatanaka ................. G11B 5/70
428/212
5,643,686 A * 7/1997 Isshiki ..................... G11B 5/70
428/839.3
(Continued)

FOREIGN PATENT DOCUMENTS

| CN | 101792306 | 8/2010 |
|---|---|---|
| JP | 59-065928 | 4/1984 |

(Continued)

OTHER PUBLICATIONS

Office Action dated Aug. 13, 2019 in corresponding Chinese Patent Application No. 201780025461.6 with English translation.
(Continued)

*Primary Examiner* — Ronak C Patel
(74) *Attorney, Agent, or Firm* — Wenderoth, Lind & Ponack, L.L.P.

(57) ABSTRACT

The present invention provides a powdered ferrite having high dispersibility in a resin and high electromagnetic shielding characteristics. The powdered ferrite comprises platy ferrite particles having a spinel crystal structure. The powdered ferrite comprises at least 50 number % platy ferrite particles each having at least one protrusion on a surface of the particle, and the protrusion has a shape selected from the group consisting of a rectangular pyramid,
(Continued)

a truncated rectangular pyramid, an elongated rectangular pyramid, and combinations thereof.

14 Claims, 2 Drawing Sheets

(51) Int. Cl.
    *C08K 3/22* (2006.01)
    *H01F 1/34* (2006.01)
    *H01F 1/375* (2006.01)
    *H05K 1/02* (2006.01)

(52) U.S. Cl.
    CPC ........... *H01F 1/375* (2013.01); *H05K 1/0216* (2013.01); *C01P 2002/32* (2013.01); *C01P 2004/03* (2013.01); *C01P 2004/20* (2013.01); *C01P 2004/54* (2013.01); *C01P 2006/42* (2013.01); *C08K 2003/2296* (2013.01); *C08K 2201/003* (2013.01); *C08K 2201/01* (2013.01); *C08K 2201/016* (2013.01)

(56) References Cited

U.S. PATENT DOCUMENTS

| | | | | |
|---|---|---|---|---|
| 6,017,631 | A * | 1/2000 | Yamamoto | G11B 5/70678 428/403 |
| 2001/0038353 | A1* | 11/2001 | Toyoda | H01Q 17/00 342/1 |
| 2005/0089722 | A1* | 4/2005 | Masaki | G11B 5/70 428/842.8 |
| 2007/0087282 | A1* | 4/2007 | Iinuma | C01G 49/0018 430/111.31 |
| 2008/0297950 | A1* | 12/2008 | Noguchi | G11B 5/00821 360/313 |
| 2014/0132440 | A1* | 5/2014 | Hirose | H05K 9/0052 342/4 |
| 2015/0277256 | A1* | 10/2015 | Sawamoto | C01G 49/0072 430/111.1 |
| 2018/0182428 | A1* | 6/2018 | Kasada | G11B 5/708 |

FOREIGN PATENT DOCUMENTS

| | | |
|---|---|---|
| JP | 61-77626 | 4/1986 |
| JP | 63-144117 | 6/1988 |
| JP | 10-233309 | 9/1998 |
| JP | 2000-252113 | 9/2000 |
| JP | 2001-015312 | 1/2001 |
| JP | 2001-15312 | 1/2001 |
| JP | 2001-284118 | 10/2001 |
| JP | 2005-109040 | 4/2005 |
| JP | 2005-272229 | 10/2005 |
| JP | 2015-196607 | 11/2015 |
| WO | 2014/042142 | 3/2014 |

OTHER PUBLICATIONS

Office Action dated Feb. 19, 2019 in corresponding Chinese Patent Application No. 201780025461.6 with English translation.
Su et al., "Effects of composition and sintering temperature on properties of NiZn and NiCuZn ferrites". Journal of Magnetism and Magnetic Materials, vol. 310, pp. 17-21, 2007.
International Search Report dated May 23, 2017 in International (PCT) Application No. PCT/JP2017/014263, with English-language translation.
Written Opinion of the International Searching Authority dated May 23, 2017 in International (PCT) Application No. PCT/JP2017/014263, with English-language translation.
Extended European Search Report dated Mar. 21, 2019 in corresponding European Patent Application No. 17792658.1.
Hallynck et al., "Synthesis of high aspect ratio of $Ni_{10.5}Zn_{0.5}Fe_2O_4$ platelets for electromagnetic devices", Solid State Sciences, vol. 8, No. 1, pp. 24-30 (2006).
Yang et al., "Enhanced microwave magnetic and attenuation properties of composites with free-standing spinel ferrite thick films as fillers", Journal of Magnetism and Magnetic Materials, vol. 324, No. 19, pp. 3144-3148 (2012).
Office Action dated Mar. 20, 2019 in corresponding Korean Patent Application No. 10-2018-7029788 with English translation.

\* cited by examiner

FERRITE POWDER, RESIN COMPOSITION, ELECTROMAGNETIC SHIELDING MATERIAL, ELECTRONIC CIRCUIT SUBSTRATE, ELECTRONIC CIRCUIT COMPONENT, AND ELECTRONIC DEVICE HOUSING

TECHNICAL FIELD

The present invention relates to powdered ferrite, resin compositions, electromagnetic shielding materials, electronic circuit boards, electronic circuit components, and housings for electronic devices comprising the powdered ferrite.

BACKGROUND ART

Accompanied by digitalization, an improvement in performance, and a reduction in size of recent electronic communication devices, there have been concerns about malfunctions of these devices and adverse effects over human bodies which are caused by noises or electromagnetic waves generated from their neighboring devices. Such concerns have led to an increasing demand for electromagnetic wave absorbing materials and electromagnetic shielding materials which prevent leakage of electromagnetic waves from their sources or shield external electromagnetic waves. In particular, an increase in data transfer rate and processing rate leads to high-rate transmission of signals at higher frequencies, and accordingly, electromagnetic wave absorbing materials and electromagnetic shielding materials exhibiting high performance at high-frequency regions have been required.

Ferrite materials have high magnetic permeability, and have been used as electromagnetic wave absorbing materials or electromagnetic shielding materials. It is known about the electromagnetic wave absorbing characteristics of ferrite that the electromagnetic wave absorbing region ranges over a region higher than the natural resonant frequency. It is also known that the shape of ferrite significantly affects the electromagnetic wave absorbing characteristics, and that the orientation of platy or flat ferrite particles prevents leakage of electromagnetic waves because voids between these particles are reduced in size through the orientation. A variety of methods of producing such platy or flat ferrite particles have been proposed.

For example, Patent Literature 1 (JPH10-233309A) discloses a flat ferrite powder prepared through milling of a soft magnetic ferrite prepared by casting, wherein the powder has a longitudinal length of 1 to 100 μm and an aspect, ratio of 5 to 100. Patent Literature 1 also discloses a method of producing the flat ferrite powder, comprising a melting step of melting a raw material of soft magnetic ferrite under predetermined atmosphere; a casting step of casting the molten metal prepared in the melting step into a mold pre-heated under a predetermined atmosphere, and cooling the mold under a specific condition to yield an ingot of soft magnetic ferrite; and a pulverizing step of pulverizing the ingot prepared in the casting step with a pulverizer. According to Patent Literature 1, this flat ferrite powder has a high magnetic permeability and flat shape, and therefore, can be contained in a magnetic shielding sheet in an oriented form along the sheet face, improving the magnetic shielding characteristics of the sheet in a frequency range higher than 1000 MHz. This method can facilitate the production of the flat ferrite powder only through milling of the ferrite ingot cast under established conditions, without performing hard work, such as milling of spherical powder. This method contributes to a simplified process of producing ferrite powder for a magnetic shielding material in the form, of a sheet, and thus has high industrial significance.

Patent Literature 2 (JP2001-284118A) discloses a powdered ferrite comprising flat ferrite particles, wherein at least part of the flat ferrite particles has the major diameter d in the range of 1 μm or more and 100 μm or less, and has a ratio (d/t) of the major diameter d to the thickness t in the range of $2.5 \leq (d/t)$. Patent Literature 2 also discloses a method comprising forming a ferrite raw material in a sheet, firing the sheet to form ferrites, and pulverizing the ferrite sheet into ferrite particles containing flat ferrite particles. This method can provide a powdered ferrite suitable for a magnetic composite body having high magnetic permeability or high noise absorbing characteristics in a high frequency bandwidth and further having high reliability in insulation. In addition, the method can provide the powdered ferrite readily and safely.

Patent Literature 3 (JP2000-252113A) discloses a powdered soft magnetic ferrite and a composite material comprising the powdered soft magnetic ferrite, wherein the soft magnetic ferrite particles have a plate shape, and has a composition represented by $Mg_aCu_bZn_cFe_dO_4$ (where $0.3 \leq a \leq 0.5$, $0 \leq b \leq 0.2$, $0.4 \leq c \leq 0.6$, and $1.8 \leq d \leq 2.2$). The composite material prepared by dispersing the powdered soft magnetic ferrite into a matrix has a relative permeability having a high real part in the low frequency bandwidth, and can absorb electromagnetic waves in a wide bandwidth at a high-frequency. In addition, the composite material has high workability and flexibility. The powdered soft magnetic ferrite is prepared through firing of a ferrite raw material at a temperature of 1200° C. or less using platy $\alpha$-$Fe_2O_3$ as a source of Fe element.

Other methods of producing platy ferrite powder are disclosed, which involves applying a ferrite raw material comprising a variety of metal oxides or calcined powder in an organic solvent onto a base, removing the organic solvent, and firing the ferrite raw material. For example. Patent Literature 4 (JP2001-15312A) discloses a method of producing a magnetic paste for electromagnetic wave absorption, involving applying a mixed solution of nanoparticulate ferrite and a binder onto a film to form a ferrite sheet, removing the ferrite sheet from the film; pulverizing and subsequently firing the ferrite sheet into ferrite powder; and mixing the ferrite powder with a paste material. This method can produce a magnetic paste for electromagnetic wave absorption comprising ferrite particles having an aspect ratio of 10 or more. Such a magnetic paste enables absorption of electromagnetic waves at high absorptivity over a wide bandwidth at a high-frequency.

Patent Literature 5 (JP2015-196607A) discloses a method of producing a granulated product for platy particles, involving applying a hydrophilic ink containing a filler onto a hydrophobic base, and solidifying the ink into a coating; immersing the coating containing water into a solvent with the base; and recovering the coating. This method is suitable for production of platy ferrite particles used in the applications to electromagnetic wave absorbing materials and electromagnetic shielding materials.

CITATION LIST

Patent Literature

Patent Literature 1: JPH10-233309A
Patent Literature 2: JP2001-284118A

Patent Literature 3: JP2000-252113A
Patent Literature 4: JP2001-15312A
Patent Literature 5: JP2015-196607A

SUMMARY

As described above, Patent Literatures listed above disclose platy ferrite particles and methods of producing the particles. Unfortunately, in the case where these ferrite particles are dispersed in a resin as a filler to prepare a resin composition, these ferrite particles cannot be sufficiently dispersed under high content with high orientation of the ferrite panicles. In use as an electromagnetic shielding materiel, a higher content of ferrite particles in the resin is desirable to enhance the electromagnetic shielding characteristics. At such a higher content, however, the resin cannot be sufficiently spread into voids between the platy particles, precluding high orientation and sufficient dispersion of the ferrite particles. For this reason, platy ferrite particles having electromagnetic shielding characteristics while allowing the resin to spread sufficiently into the voids between the platy particles at a higher filler content are not yet in practical use.

As a result of extensive research, the present inventor has found that the above problems are solved by a powdered ferrite comprising platy ferrite particles having a protrusion having a specific shape on their surfaces in a specific proportion. The present inventor also has found that the powdered ferrite has high electromagnetic shielding characteristics, and has completed the present invention.

Accordingly, an object of the present invention is to provide a powdered fence having high dispersibility in a resin and high electromagnetic shielding characteristics. Another object of the present invention is to provide a resin composition, an electromagnetic shielding material, an electronic circuit board, an electronic circuit component, and a housing for electronic devices which comprise such a powdered ferrite.

One aspect according to the present invention is a powdered ferrite comprising platy ferrite particles having a spinel crystal structure,
wherein the powdered ferrite comprises at least 50 number % platy ferrite particles each having at least one protrusion on a surface of the particle, and the at least one protrusion has a shape selected from the group consisting of a rectangular pyramid, a truncated rectangular pyramid, an elongated rectangular pyramid, and combinations thereof.

Since the powdered ferrite comprises such platy ferrite particles having a protrusion having a specific shape on their surfaces, the powdered ferrite has not only high dispersibility in a resin but also high productivity and nigh electromagnetic shielding characteristics.

Another aspect according to the present invention provides a resin composition comprising the powdered ferrite and a resin.

Still another aspect according to the present invention provides an electromagnetic shielding material comprising the powdered ferrite as a filler.

A further aspect according to the present invention provides an electronic circuit board, an electronic circuit component, or a housing for electronic devices comprising the powdered ferrite and/or the resin composition and/or the electromagnetic shielding material, wherein the electronic circuit board, electronic circuit component, or housing for electronic devices has an electromagnetic shielding effect.

Such a resin composition, electromagnetic shielding material, electronic circuit board, electronic circuit component, and housing for electronic devices have flexibility, and can be shaped to have a curved surface. Moreover, the resin composition, electromagnetic shielding material, electronic circuit board, electronic circuit component, and housing for electronic devices can be safely used for a long time without surface oxidation because ferrite, which is an oxide, is used.

DESCRIPTION OF EMBODIMENTS

Powdered Ferrite

Figure 1:
FIG. 1 is a sectional view illustrating a resin composition.

The powdered ferrite according to the present invention comprises platy ferrite particles having a spinel crystal structure, and can be used as a filler for an electromagnetic shielding material. This powdered ferrite has high magnetic permeability and high electromagnetic shielding characteristics because ferrite particles contained in the powdered ferrite has a spinel crystal structure. Voids between such ferrite particles having a platy shape are reduced through the orientation of the particles, preventing the leakage of electromagnetic waves. Throughout the specification, the powdered ferrite indicates a mass of ferrite particles, and the ferrite particles indicate individual particles.

The powdered ferrite contains platy ferrite particles each having at least one protrusion on a surface of the particle. If particles in the powdered ferrite have no protrusion on their surface, then resin cannot sufficiently fill voids between the particles when the powdered ferrite is dispersed in the resin at a high filler content, which results in uneven strength of the resin composition. If such a resin composition is formed to have a curved surface with a desired curvature, the curved surface will be bent in the middle. In addition, the filler localized in the curved surface may cause uneven electromagnetic shielding characteristics. Accordingly, the platy ferrite particles have at least one protrusion on their surfaces. As an upper limit, any number of protrusions can be present on the surfaces of the particles as, long as electromagnetic wave shielding characteristics are satisfied. Typically, 30 protrusions at most are contained. The protrusions are formed utilizing abnormal growth during the crystal growth of ferrite. Therefore, the number of protrusions can be controlled through the control of oxygen content during the sintering and/or heat treatment steps in the production of ferrite.

The powdered ferrite contains platy ferrite particles having protrusions (particles with protrusions) at 50 number % or higher. A content of less than 50 number % is more likely to cause the contact of the platy ferrite particles with each other, preventing the resin from filling voids between the particles when the particles are dispersed in a resin. The upper limit of the content is not limited. The maximum content may be 100 number %.

Since the ferrite particles have a spinel crystal structure, the protrusion, has a shape selected from the group consisting of a rectangular pyramid, a truncated rectangular pyramid, an elongated rectangular pyramid, and combinations thereof. These shapes reflect the crystal structure. Other rounded protrusions are attributed to grains which are formed through normal crystal growth and are present in the ferrite particles. These rounded protrusions are distinguished from those reflecting the crystal structure described above.

In the powdered ferrite according to the present invention, the protrusion preferably has a height smaller than the thickness of the platy ferrite particle. Such a protrusion reduces the gap distance between the particles when the platy powdered ferrite is dispersed, oriented, and molded in a resin. For this reason, a sufficient amount of filler can be used, and a molded article having a desired thickness can be readily produced. The height of the protrusion can be controlled by the temperature during the sintering and/or heat treatment steps in the production of ferrite. A higher treatment temperature can readily produce higher protrusions.

The height of the protrusion can be measured as follows: A cross-section of a sample is prepared, and the height of the protrusion from the surface of each particle is measured, as in the measurement of the average, thickness which will be described later. The SEM image may be photographed by the same method as in the measurement of the average thickness described later. If the number of protrusions is small, this may obstruct the observation of a sufficient number of samples in the cross-sectional area. In such a case, an SEM image of particles may be photographed and printed out as in the measurement of the average plate diameter which will be described later. The particles substantially standing upright may be selected from the particles in the photographed image, and the thicknesses of the platy particles and the heights of the protrusions may be directly measured with a scale. In either case, 100 particles having protrusions are selected, and the heights of the protrusions of the particles are measured. The arithmetic average of the measured heights is defined as the height of the protrusions.

The platy ferrite particles have an average particle diameter of preferably 10 to 2000 μm, more preferably 20 to 1000 μm, still more preferably 20 to 500 μm. The average particle diameter indicates the average of the lengths of the platy ferrite particles in the major axis direction (average length in the major axis direction). An average particle diameter of 10 μm or more can achieve ferrite particles having a sufficient aspect ratio, which reduce the influence of the demagnetizing field generated by the ferrite particles, and further enhance the electromagnetic shielding characteristics. An average particle diameter of 2000 μm or less can prevent the fusion of the particles during the sintering step in the production of the powdered ferrite, and can reduce the thickness of the particle in the minor axis direction, facilitating the production of the platy particles having a desired thickness.

The average plate diameter (average length in the major axis direction) can be determined as follows. An SEM image of ferrite particles is photographed with a field emission scanning electron microscope (FE-SEM), and the length is measured for each particle using the automatic particle analyzing function of an energy dispersive X-ray spectrometer (EDX). Among the measured particles excluding those observed in the thickness direction, those fixed in a standing state during the FE-SEM observation, and those including a plurality of particles recognized as one particle, the average of the diameters of 100 platy particles is defined as the average plate diameter. The SEM image may be photographed with an FE-SEM SU-8020 made by Hitachi High-Technologies Corporation at an accelerating voltage of 15 KV and a magnification of 200×, and may be subjected to automatic particle analysis over several fields with an EDX X-MAX made by HORIBA, Ltd. while image information is being received from the FE-SEM.

The platy ferrite particles have an average thickness of preferably 0.5 to 100 μm, more preferably 1 to 50 μm, still more preferably 2 to 30 μm. The average thickness indicates the average of the lengths (thicknesses) of the platy ferrite particles in the minor axis direction (average length in the minor axis direction). Ferrite particles having an average thickness of 0.5 μm or higher can further enhance the electromagnetic shielding characteristics of the powdered ferrite. This is because such ferrite particles have sufficient strength to prevent crack during the production of articles, in contrast, ferrite particles having an average thickness of 100 μm or less can achieve production of molded articles having a smoother curved surface from a resin composition comprising the powdered ferrite containing such ferrite particles. This is because the ferrite particles are less protruding from the curved surface.

The average thickness (average length in the minor axis direction) of the ferrite particles can be determined as follows. Powdered ferrite (9 g) and powdered resin (1 g) are placed into a 50-cc glass bottle, and are mixed in a ball mill for 30 minutes. The mixture is placed in a die having a diameter of 13 mm, and is molded under a pressure of 30 MPa. The molded article in a vertically standing state is then embedded in a resin such that the cross-section of the molded article can be observed. The molded article is polished with an abrasive machine, and is used as a sample for measuring the thickness of the ferrite particle. The sample for measuring the thickness of the ferrite particle is photographed at a magnification of 50× to 800× with an SEM, and the thickness (length in the minor axis direction) of each particle is measured in disregard of protrusions from the particle in the SEM photograph. The arithmetic average of the thicknesses of 100 particles is calculated, and is defined as the average thickness of the ferrite particles. The magnification of the SEM photograph to be taken can be selected according to the plate diameter and thickness of the particle.

The platy ferrite particles have an aspect ratio of preferably 4 to 1000, more preferably 4 to 300, still more preferably 5 to 200. An aspect ratio of 4 or more can reduce the influence of the demagnetizing field generated by the ferrite particles, and can further enhance the electromagnetic wave shielding characteristics. In contrast, an aspect ratio of 1000 or less can achieve the compatibility between the electromagnetic shielding characteristics and the flexibility of the resin molded article (resin composition). The aspect ratio is calculated as a ratio of the average plate diameter to the average thickness (average plate diameter/average thickness) of the platy ferrite particles.

The platy ferrite particles preferably have indefinite shapes. The term "indefinite shape" used herein indicates that the particle has a substantially constant shape in one direction (thickness direction or minor axis direction) and do not have any regular shape, such as a circular or polygonal shape, in the other two directions, in the three-dimensional shape. In this case, the particle has a perimeter consisting of a combination of straight lines and curved lines. When oriented in a specific direction, platy ferrite particles having such an indefinite shape preclude the formation of the voids therebetween, facilitating an enhancement in electromagnetic shielding characteristics.

The platy ferrite particles have a shape factor SF-2 of preferably 135 to 300 more preferably 140 to 300, still more preferably 140 to 280. The shape factor SF-2 is an index indicating the indefinite shape. A shape factor SF-2 closer to 100 indicates that the particle has a shape closer to a sphere or a circle. In contrast, a large shape factor SF-2 indicates that the perimeter of the particle has a large deviation from the envelope and increased recessed portions. A shape factor SF-2 of 135 or more can produce powdered ferrite at reduced cost, and can further enhance the electromagnetic shielding characteristics. This is because ferrite particles having a shape close to a sphere have low productivity, and easily make voids between the ferrite particles through which electromagnetic waves readily pass when the ferrite particles are accumulated to form the electromagnetic shielding material. In contrast, a shape factor SF-2 of 300 or less can further enhance the electromagnetic shielding characteristics. This is because platy ferrite particles tightly packed on a plane prevent an increase in excessively recessed portions, and thus the formation of voids. The shape factor SF-2 is calculated from the following expression, i.e., by dividing the square of the projected perimeter L by the projected area S of a particle and 4π, followed by multiplication by 100:

$$SF\text{-}2 = (L^2/S/4\pi) \times 100, \quad \text{[Expression 1]}$$

where L represents the projected perimeter, and S represents the projected area.

The shape factor SF-2 can be measured as in the measurement of the average plate diameter. An SEM image of ferrite particles is photographed with an FE-SEM, and the perimeter and projected area of each particle is measured using the automatic particle analyzing function of an EDX to calculate the shape factor SF-2 of the particle. Among, the measured particles excluding those observed in the thickness direction, those fixed in a standing state during the FE-SEM observation, and those including a plurality of particles recognized as one particle, the average of 100 particles is defined as a shape factor SF-2.

The platy ferrite particles preferably comprise Ni—Zn ferrite or Ni—Zn—Cu ferrite. These ferrites readily cause abnormal crystal growth, and can facilitate the production of a powdered ferrite containing platy ferrite particles having protrusions. Ni—Zn ferrite and Ni—Zn—Cu ferrite more readily cause abnormal crystal growth through control of only the oxygen content, specifically, a reduction of the oxygen content during the sintering step and/or heat treatment steps in the production of ferrite particles. Thus, these ferrites can more readily and effectively form platy ferrite particles having protrusions, compared to Mn—Zn ferrite or Mn ferrite. Ni—Zn ferrite or Ni—Zn—Cu ferrite can have any composition. In a preferred composition, the contents of Fe, Ni, Zn, and Cu elements are 45 to 52 wt %, 5 to 25 wt %, 0.5 to 25 wt %, and 0 to 6 wt %, respectively.

Resin Composition (Electromagnetic Shielding Material)

The resin composition (resin molded article) according to the present invention is prepared through curing or thermosetting of a composition comprising a mixture of the powdered ferrite and a resin. The resin composition desirably contains 50 to 99.5 wt % powdered ferrite. At a content of 50 wt % or more, the composition can sufficiently demonstrate the characteristics of the ferrite. In contrast, a content of 99.5 wt % or less can facilitate the molding of the resin composition. The resin used in the resin composition preferably has flexibility. Such a flexible resin enables the resin composition to be processed to have a curved surface. Examples of the resin include, but should not be limited to, epoxy resins, phenol resins, melamine resins, urea resins, fluororesins, and poly(vinyl alcohol). This resin composition may contain a variety of additives, such as a curing agent, a curing accelerator, and silica particles, when necessary. FIG. 1 illustrates an example cross-section of the resin composition. A resin composition 1a illustrated in FIG. 1 comprises powdered ferrite 2a and resin 3. As described above, the composition 1a of flexible resin can be processed to have a curved surface.

Figure 2:
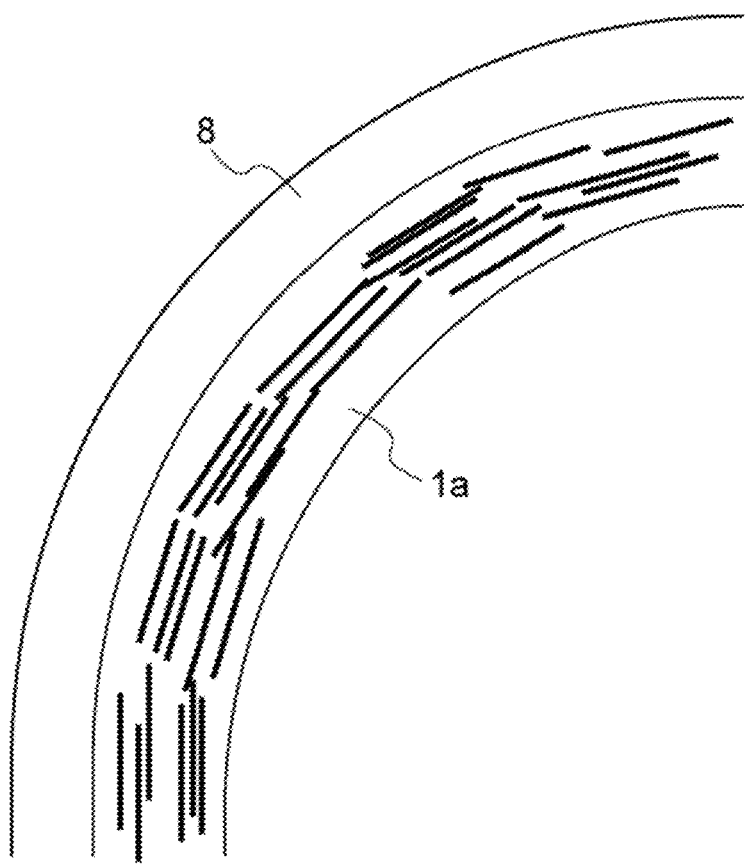
FIG. 2 is a sectional view illustrating a housing for electronic devices.

The resin composition comprising the powdered ferrite as a filler can be used as an electromagnetic shielding material. This electromagnetic shielding material can be bonded to base bodies, and has high electromagnetic shielding characteristics derived from the powdered ferrite. In addition, the electromagnetic shielding material can have high flexibility attributed to high dispersibility of the powdered ferrite. Such high flexibility allows a high degree of freedom in shape of the body to be bonded to, and therefore, the electromagnetic shielding material can be bonded to a base body having a curved surface. The electromagnetic shielding material can be bonded to the base body by any means, for example, hydraulic transfer, Electronic Circuit Board, Electronic Circuit Component, and Housing for Electronic Devices The electronic circuit board, electronic circuit component, and housing for electronic devices according to the present invention comprise the electromagnetic shielding material, and have a high electromagnetic shielding effect. Due to high flexibility of the electromagnetic shielding material, the electronic circuit board, electronic circuit component, and housing for electronic devices according to the present invention have a high degree of freedom in shape, and can have curved surfaces to be bonded to the electromagnetic shielding material. FIG. 2 is a sectional view illustrating an example housing for electronic devices which accommodates an electronic circuit. In FIG. 2, the resin composition 1a is disposed on and along the curved outer peripheral surface of an electromagnetic wave shield 8 made of a metal, and serves as an electromagnetic shielding material.

Production of Powdered Ferrite

The production of the powdered ferrite according to the present invention will now be described.

(1) Preparation of Calcined Product

For the production of the powdered ferrite according to the present invention, ferrite raw materials are weighed, and are mixed with a Henschel mixer or the like. Examples of the ferrite raw materials include, but should not be limited to, metal oxides, metal carbonates, metal hydroxides, and mixtures thereof. The mixture of ferrite raw materials can be pelletized with a roll compactor or the like, and is calcined in a rotary kiln or the like. The calcination is performed at a temperature of 1000° C. in ambient atmosphere, for example.

(2) Preparation of Ink

In the next step, the calcined product is coarsely and then finely milled. The water content is adjusted to yield cakes of calcined product. A dispersant is added to the cakes of calcined product, and is dispersed with a disperser to prepare aqueous ink. A binder is further added thereto to prepare ink for coating.

(3) Preparation of Ferrite Precursor

The ink for coating is then applied into a predetermined thickness onto a base material, such as a film, using an applicator, for example. After the application of the ink, a PVA aqueous solution is further applied onto the ink coated surface, and water is removed. The ink coated surface is peeled off from the base material to yield a platy granulated product (ferrite precursor) before sintering.

(4) Binder Removal and Sintering

The binder is removed from the platy granulated product (ferrite precursor) before sintering, followed by sintering the platy granulated product. The binder removal is preferably performed at a temperature equal to or lower than the sintering temperature preferably under a condition such that the binder component can be removed. The sintering can be performed at a temperature of about 800 to 1300° C. in an atmosphere where the oxygen content is 20 vol % or less, preferably 3.5 vol % or less. Such a reduced oxygen content can form protrusions accompanied by the abnormal crystal growth. On the other hand, in the case where a heat treatment is performed as described later, the sintering may be performed in ambient atmosphere.

(5) Milling

The ferrite precursor before the sintering and/or the sintered product after the sintering may be milled to adjust the plate diameter, when necessary. Platy ferrite particles having a predetermined shape can be readily produced through the milling. In the milling, the ferrite precursor before the sintering and/or the sintered product after the sintering may be milled, and may be classified through a sieve having a predetermined opening to have a target plate diameter. The adjustment of the plate diameter through the milling may be performed after the sintering, or may be performed before the binder removal and/or sintering steps to prevent the fusion between the particles during the sintering step. In this specification, the milling performed before the sintering is referred to as pre-sintering milling, and the milling performed after the sintering is referred to as post-sintering milling for clarity, when necessary.

(6) Heat Treatment

In the case where the milling is performed after the sintering (post-sintering milling), a heat treatment (annealing) may be performed after the milling as necessary. The direction of crystal growth of the platy ferrite particles is substantially restricted to the plane direction thereof, and therefore the platy ferrite particles have a crystal structure which is more readily distorted than bulky ferrite. Furthermore, the crystal structure of the ferrite particles is more likely to be distorted through the milling. The distortion of the crystal structure can be reduced through the heat treatment performed after the sintering and milling steps. The heat treatment may be performed at a temperature of about 800 to 1300° C. in an atmosphere where the oxygen content is 20 vol % or less, preferably 3.5 vol % or less. Such a reduced oxygen content can form protrusions accompanied by the abnormal crystal growth.

The powdered ferrite prepared through these steps comprises platy ferrite particles having protrusions having a specific shape on the surfaces thereof. Such a powdered ferrite has high dispersibility in resins and a significantly increased plate diameter, thus achieving high electromagnetic shielding characteristics. In addition, the powdered ferrite also has high productivity. The ruin compositions and the electromagnetic shielding materials comprising the powdered ferrite as a filler have high flexibility attributed to high dispersibility of the powdered ferrite, and can be bonded to base bodies (housings) having curved surfaces.

In contrast, the methods disclosed in Citation List have difficulties in production of platy powdered ferrite having high dispersibility and productivity together with a large plate diameter. For example, in the methods disclosed in Patent Literatures 1 to 3, the length (long diameter) in the plane direction is inevitably restricted. In addition, the thickness may be increased depending on the method of producing a sheet, substantially precluding powdered ferrite having a desired aspect ratio. Patent Literature 2 does not disclose any information on the shape of the particles of the powdered ferrite other than the long diameter, the plate thickness, and the aspect ratio thereof. Patent Literature 3 discloses ferrite particles having indefinite shapes and a piety shape. However, in the method disclosed in this literature, a sufficient aspect ratio cannot be achieved due to a significantly small ferrite particle diameter, or the grain size of the Write particles cannot be sufficiently ensured due to a significantly low sintering temperature. As a result, the powdered ferrite may inevitably have a low magnetic permeability, which is used as a substituting index indicating the electromagnetic wave absorbing characteristics.

In the case where the ferrite sheet is prepared by peeling off from the film to obtain the ferrite sheet solely as disclosed in Patent Literature 4, the ferrite sheet could be broken. It is difficult to obtain the powdered ferrite in a stable state. In particular, a thinner ferrite sheet is more difficult to peel off from the base material, imposing more difficulties in the actual production process. To avoid the breakage of the ferrite sheet during the peeling-off stage from the film, a large amount of binder components needs to be added to a mixed coating solution. An increase in binder components will increase the viscosity of the coating solution containing the ferrite raw material. The content of the ferrite raw material in the coating solution could be reduced to adjust the viscosity. However, in such a case, holes are readily formed during the sintering of the ferrite sheet. The holes formed may cause a reduction in magnetic permeability, which is used as a substituting index indicating the electromagnetic shielding characteristics. The method disclosed in Patent Literature 5, on the other hand, offers a clue to solve the problems in the related art. Unfortunately, since ager is used as the binder, the ink (slurry) should be always kept at a specific temperature during the application of the ink, which imposes difficulties in productivity.

EXAMPLES

The present invention will now be described in more detail by way of Examples.

Example 1

A powdered ferrite was prepared in accordance with the following procedure. Detailed conditions for production are also shown in Table 1.

(1) Preparation of Calcined Product

Iron oxide, nickel oxide, zinc oxide, and copper oxide as raw materials were weighed such that the amounts of $Fe_2O_3$, NiO, ZnO, and CuO were 51.5 mol, 15 mol, 30 mol, and 8 mol, respectively, and were mixed with a Henschel mixer. The mixture was pelletized with a roll compactor, and was calcined with a rotary kiln in ambient atmosphere at a temperature of 950° C. A calcined product was thereby yielded.

(2) Preparation of Ink

Ink was prepared from the calcined product. The calcined product was coarsely milled with a rod mill, and then finely milled with a wet bead mill. The water content was adjusted to give a solid content of 65 wt %. Cakes of the calcined product were thereby yielded. A dispersant was added to the cakes of the calcined product, and was dispersed with a homogenizer to prepare aqueous ink. A poly(vinyl alcohol) (PVA) binder was further added to the aqueous ink in an amount of 5 wt % of the water content in the aqueous ink. Ink for coating was thereby prepared.

(3) Preparation of Ferrite Precursor

A ferrite precursor was prepared with the resulting ink for coating. The ink was applied onto a base material. The ink was applied onto a commercially available PET film (thickness: 50 μm), i.e. base material, with an applicator into a film having a thickness after drying (dry thickness) of 10 μm. After the coating of the ink, water was removed from the coated surface. A PVA aqueous solution (25 wt % aqueous solution) was further applied onto the ink coated surface, and was dried. The coated surface was peeled off from the base material to prepare a green platy granulated product (ferrite precursor) in the form of a sheet.

(4) Binder Removal and Sintering

The binder was removed from the ferrite precursor in the air at 650° C. The ferrite precursor was then sintered at 1200° C. for four hours in an atmosphere containing 0 vol % oxygen, yielding a platy sintered product.

(5) Milling

The platy sintered product was milled (post-sintering milling) to yield a powdered ferrite. The sintered and milled product was classified with sieves (36 mesh and 80 mesh) in accordance with Japanese Industrial Standards (JIS). The powdered ferrite contained platy ferrite particles having an average thickness of 8 μm and an average plate diameter of 489 μm.

Example 2

A powdered ferrite was prepared as in Example 1 except that the dry thickness during the application of the ink was 3.5 μm, the binder was removed at a temperature of 1000° C., and sieves (80 mesh and 250 mesh) in accordance with JIS were used in the milling.

Example 3

A powdered ferrite was prepared as in Example 2 except that the sintering was performed in ambient atmosphere, and a heat treatment was performed at 1220° C. in an atmosphere containing 0 vol % oxygen after the milling.

Example 4

A powdered ferrite was prepared as in Example 1 except that raw materials, i.e., iron oxide ($Fe_2O_3$), nickel oxide (NiO), zinc oxide (ZnO), and copper oxide (CuO) were compounded in amounts of 49 mol, 15 mol, 30 mol, and 6 mol, respectively the dry thickness after the application of the ink was 9 μm, and sieves (80 mesh and 250 mesh) in accordance with JIS were used in the milling.

Example 5

A powdered ferrite was prepared as in Example 1 except that raw materials, i.e., iron oxide ($Fe_2O_3$), nickel oxide (NiO), zinc oxide (ZnO), and copper oxide (CuO) were compounded in amounts of 52.75 mol, 15 mol, 30 mol, and 9 mol, respectively, the dry thickness during the application of the ink was 11 μm, and sieves in accordance with JIS (250 mesh and 350 mesh) were used in the miffing.

Example 6

A powdered ferrite was prepared as in Example 2 except that the milling before sintering (pre-sintering milling) was performed rather than the milling after the sintering (post-sintering milling). In the pre-sintering milling, a ferrite precursor after the binder removal was milled, and was classified with sieves (36 mesh and 80 mesh) in accordance with JIS.

Example 7

A powdered ferrite was prepared as in Example 2 except that the sintering temperature was 1090° C., and sieves (36 mesh and 80 mesh) in ante with JIS were used in the milling.

Example 8

A powdered ferrite was prepared as in Example 7 except that the sintering temperature was 1250° C.

Example 9

A powdered ferrite was prepared as in Example 2 except that the sintering was performed in an atmosphere containing 8 vol % oxygen, and the milling (post-sintering milling) was not performed.

Example 10 (Comparative)

A powdered ferrite was prepared as in Example 1 except that the binder was removed at a temperature of 1000° C. and the sintering was performed in ambient atmosphere.

Example 11 (Comparative)

A powdered ferrite was prepared as in Example 10 except that a heat treatment was performed at 1220° C. in ambient atmosphere after the milling (post-sintering milling) was performed.

Example 12 (Comparative)

A powdered ferrite was prepared as in Example 2 except that the PVA aqueous solution was not applied during the preparation of the ferrite precursor, the sintering was performed in ambient atmosphere, and a sieve (350 mesh) in accordance with JIS was used in the milling (post-sintering milling).

Example 13 (Comparative)

A powdered ferrite was prepared as in Example 1 except that the binder was removed at a temperature of 1000° C. and the sintering temperature was 1050° C.

Example 14 (Comparative)

A powdered ferrite was prepared as in Example 13 except that the sintering temperature was 1310° C.

Evaluations

Characteristics of the powdered ferrite in Examples 1 to 14 sere evaluated as follows, <Chemical Analysis>

The composition of the powdered ferrite was determined by chemical analysis. Ferrite particles (0.2 g) were weighed, and were completely dissolved in a heated solution of 1N hydrochloric acid (20 ml) and 1N nitric acid (20 ml) in pure water (60 ml) to prepare an aqueous solution. The contents of the metal elements in the aqueous solution were determined with an ICP analyzer (SHIMADZU Corporation, ICPS-1000IV). Similarly, the contents of the metal elements in Examples and Comparative Examples described later were also determined.

<Average Plate Diameter and Shape Factor SF-2>

The average plate diameter and the shape factor SF-2 were determined at the same time. An SEM image of ferrite particles was photographed with an FE-SEM. The length, perimeter, and projected area of each particle were measured using the automatic particle analyzing function of an EDX to calculate the length of each particle. Among the measured particles excluding those observed in the thickness direction, those fixed in a standing state during the FE-SEM observation, and those including a plurality of particles recognized as one particle, the lengths of 100 particles were averaged to determine the average plate diameter. The SF-2 was determined from the perimeter and projected area of each particle, and the average of 100 particles was defined as a shape factor SF-2. The SEM image was photographed with an FE-SEM SU-8020 made by Hitachi High-Technologies Corporation at an accelerating voltage of 15 KV and a magnification of 200×, and was subjected to particle analysis with an EDX X-MAX made by HORIBA, Ltd. while image information was being received from the FE-SEM.

<Average Thickness>

The average thickness of the platy ferrite particles was determined as follows. Powdered ferrite (9 g) and powder resin (1 g) were placed into a 50-cc glass bottle, and were mixed in a ball mill for 30 minutes. The mixture was placed into a die having a diameter of 13 mm, and was molded under a pressure of 30 MPa. The molded article in a vertically standing state was then embedded in a resin such that the cross-section of the molded article was observed. The molded article was polished with an abrasive machine, and was used as a sample for measuring the thickness of the ferrite particle. The sample for measuring the thickness of the ferrite particle was photographed at a magnification of 50× to 800× with an SEM, and the thickness (length in the minor axis direction) of each particle was measured in disregard of protrusions from the particle in the SEM image. The arithmetic average of the thicknesses of 100 particles was calculated, and was defined as the average thickness of the ferrite particles.

<Aspect Ratio>

The aspect ratio of the platy ferrite particles was calculated as an aspect ratio (average plate diameter)/(average thickness) from the average plate diameter and the average thickness described above.

<Height of Protrusion>

The heights of protrusions of the platy ferrite particles were determined as follows: A cross-section of a sample was prepared as in the determination of the average thickness of the platy ferrite particles, and the heights of the protrusions from the surfaces of the particle were measured. An SEM image was photographed as described above. In the case where the number of protrusions is small, it is difficult to observe a sufficient number of samples in the cross-sectional area. In such a case, an SEM image of particles was photographed as in the determination of the average plate diameter, and was printed out. The particles substantially standing upright were selected from the photographed image, and the thicknesses of the platy particles and the heights of the protrusions were directly measured with a scale. In either case, 100 particles having protrusions were selected, and the heights of the protrusions of the particles were measured. The arithmetic average was defined as the height of the protrusions.

<Proportion of Particles with Protrusions>

The proportion of platy ferrite particles (particles with protrusions) each having at least one protrusion on the surface thereof contained in the powdered ferrite was determined as follows: An SEM image was photographed as in the measurement of the height of protrusions. The total number of particles and the number of particles with protrusions in the SEM image were visually counted. The proportion of the particles with protrusions was calculated from (the number of particles with protrusions)/(the total number of particles).

<Magnetic Characteristics>

The magnetic characteristics of the powdered ferrite were measured with a vibrating sample magnetometer (Toei Industry Co., Ltd., VSM-C7-10A). A sample (powdered ferrite) was filled in a cell having an inner diameter of 5 mm and a height of 2 mm. The cell was placed in the magnetometer. During the measurement, a magnetic field was applied, and was swept up to 5 K·1000/4π·A/m. In the next step, the applied magnetic field was decreased to print a hysteresis curve on a recording paper. From the data in this curve, the magnetization (σs) was read at an applied magnetic field of 5 K·1000/4π·A/m. The residual magnetization (σr) and the coercive force (Hc) were also obtained.

<Frequency Characteristics (Complex Magnetic Permeability)>

The frequency characteristics of the powdered ferrite were determined through the measurement of the complex magnetic permeability of the powdered ferrite. For the measurement of the complex magnetic permeability, a sample was prepared as follows. Powdered ferrite (9 g) and binder resin (Kynar301F: poly(vinylidene fluoride)) (1 g) were weighed, were placed into a 50-cc glass bottle, and were mixed under stirring with a ball mill at 100 rpm for 30 minutes. After stirring, about 0.6 g of the mixture was weighed, and was placed into a die having an inner diameter of 4.5 mm and an outer diameter of 13 mm. The mixture was pressed with a press under a pressure of 40 MPa for one minute. The molded article was settled in a hot air dryer at 140° C. for two hours to prepare a sample for measuring the complex magnetic permeability. The complex magnetic permeability was measured with an RF impedance/material analyzer (Agilent Technologies, Inc., E4991A) and a measuring electrode for a magnetic material (Agilent Technologies, Inc., 16454A). The outer diameter, the length in the minor axis direction, and the inner diameter of the sample were measured, and were input into the analyzer. The complex magnetic permeability (real part μ' and imaginary part μ" of the magnetic permeability) was measured at an amplitude of 100 mV where sweeping was performed in the range of 1 MHz to 1 GHz in logarithmic terms. Table 2 shows the magnetic permeabilities μ' and μ" at 13.56 MHz.

<Flexibility of Resin Molded Article>

The flexibility of the resin molded article comprising the powdered ferrite was evaluated. For the evaluation, the resin molded article was prepared as follows: A binder resin (10 wt % PVA aqueous solution) (45 g) and powdered ferrite (5 g) were mixed to disperse the powdered ferrite. The dispersion was suction-filtered through a Nutsche funnel having a diameter of 180 mm to deposit a layer of platy ferrite particles containing the binder resin on a filter paper. The layer of the platy ferrite particles was dried to remove water. The layer was then peeled off from the filter paper, and was cut into a 30 mm square to prepare a sheet containing the platy ferrite particles. The sheet was used as a resin molded article. The resin molded article was then bent along an acrylic round bar having a diameter of 20 mm to evaluate the flexibility. The flexibility was ranked according to the following criteria:

Rank A: The resin molded article was rounded without breaking.
Rank B: The resin molded article was rounded with cracks.
Rank C: The resin molded article was broken.

Results

The powdered ferrites in Examples 1 to 9 had not only superior magnetic characteristics and frequency characteristics but also high flexibility in the form of the resin molded articles. In contrast, the powdered ferrites in Examples 10 to 13 (Comparative) had poor flexibility in the form of the resin molded articles, i.e., were cracked or broken. In Example 14, powdered ferrite was not yielded because of the fusion between the particles during the sintering step.

Figure 3:
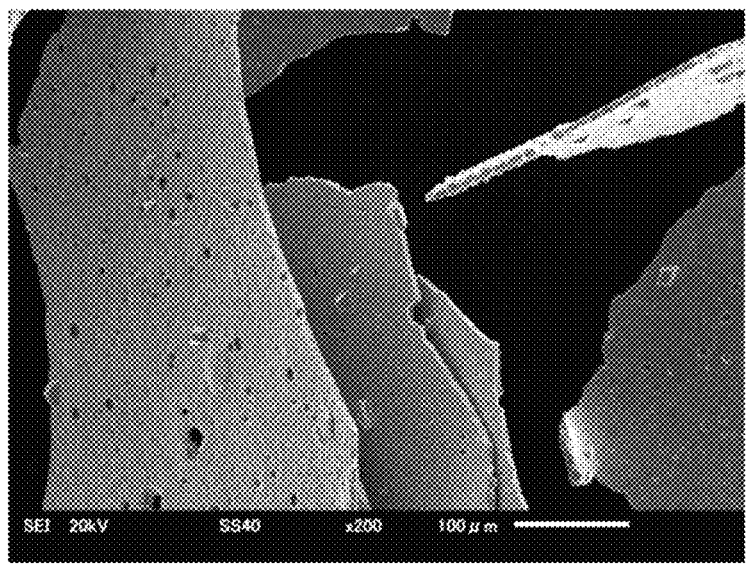
FIG. 3 is an SEM image of powdered ferrite prepared in Example 1.

An SEM image of the powdered ferrite in Example 1 is shown in FIG. 3. FIG. 3 demonstrates that individual platy ferrite particles have indefinite shapes, and each have at least one protrusion on its surface, the at least one protrusion having a shape selected from the group consisting of a rectangular pyramid, a truncated rectangular pyramid, an elongated rectangular pyramid, and combinations thereof.

Furthermore, the resin molded article prepared in Example 2 was put on water, and was bonded onto the surface of a plastic base body through hydraulic transfer to prepare a housing. Although the housing had a curved surface, the ferrite particles were successfully bonded to the housing along the curved surface. It was confirmed that the ferrite particles are applicable to curved surfaces without difficulty.

TABLE 1

| | Amounts | | | | Calcining | | Preparation of ink | | Preparation of ferrite precursor | |
| | | | | | | | | | Ink Coating | PVA Coating |
| | $Fe_2O_3$ (mol) | NiO (mol) | ZnO (mol) | CuO (mol) | Temp. (°C.) | Atmosphere | Particle diameter in Slurry (μm) | Ink Viscosity (cps) | thickness (dry thickness, μm) | thickness (wet thickness, μm) |
|---|---|---|---|---|---|---|---|---|---|---|
| Ex. 1 | 51.5 | 15 | 30 | 8 | 950 | Ambient | 0.85 | 800 | 10 | 120 |
| Ex. 2 | 51.5 | 15 | 30 | 8 | 950 | Ambient | 0.85 | 800 | 3.5 | 250 |
| Ex. 3 | 51.5 | 15 | 30 | 8 | 950 | Ambient | 0.85 | 800 | 3.5 | 250 |
| Ex. 4 | 49 | 15 | 30 | 6 | 950 | Ambient | 0.91 | 650 | 9 | 120 |
| Ex. 5 | 52.75 | 15 | 30 | 9 | 950 | Ambient | 0.80 | 900 | 11 | 120 |
| Ex. 6 | 51.5 | 15 | 30 | 8 | 950 | Ambient | 0.85 | 800 | 3.5 | 250 |
| Ex. 7 | 51.5 | 15 | 30 | 8 | 950 | Ambient | 0.85 | 800 | 3.5 | 250 |
| Ex. 8 | 51.5 | 15 | 30 | 8 | 950 | Ambient | 0.85 | 800 | 3.5 | 250 |
| Ex. 9 | 51.5 | 15 | 30 | 8 | 950 | Ambient | 0.85 | 800 | 3.5 | 250 |
| Ex. 10* | 51.5 | 15 | 30 | 8 | 950 | Ambient | 0.85 | 800 | 10 | 120 |
| Ex. 11* | 51.5 | 15 | 30 | 8 | 950 | Ambient | 0.85 | 800 | 10 | 120 |
| Ex. 12* | 51.5 | 15 | 30 | 8 | 950 | Ambient | 0.85 | 800 | 3.5 | — |
| Ex. 13* | 51.5 | 15 | 30 | 8 | 950 | Ambient | 0.85 | 800 | 10 | 120 |
| Ex. 14* | 51.5 | 15 | 30 | 8 | 950 | Ambient | 0.85 | 800 | 10 | 120 |

| | Binder removal | | Pre-sintering milling Milling condition (mesh) | Sintering | | Post-sintering milling Milling condition (mesh) | Heat treatment | |
| | Temp. (°C.) | Atmosphere | | Temp. (°C.) | Atmosphere ($O_2$ content) | | Temp. (°C.) | Atmosphere ($O_2$ content) |
|---|---|---|---|---|---|---|---|---|
| Ex. 1 | 650 | Ambient | — | 1200 | 0 vol % | 36/80 | — | — |
| Ex. 2 | 1000 | Ambient | — | 1200 | 0 vol % | 80/250 | — | — |
| Ex. 3 | 1000 | Ambient | — | 1200 | Ambient | 80/250 | 1220 | 0 vol % |
| Ex. 4 | 650 | Ambient | — | 1200 | 0 vol % | 80/250 | — | — |
| Ex. 5 | 650 | Ambient | — | 1200 | 0 vol % | 250/350 | — | — |
| Ex. 6 | 1000 | Ambient | 36/80 | 1200 | 0 vol % | — | — | — |
| Ex. 7 | 1000 | Ambient | — | 1090 | 0 vol % | 36/80 | — | — |
| Ex. 8 | 1000 | Ambient | — | 1250 | 0 vol % | 36/80 | — | — |
| Ex. 9 | 1000 | Ambient | — | 1200 | 8 vol % | — | — | — |
| Ex. 10* | 1000 | Ambient | — | 1200 | Ambient | 36/80 | — | — |
| Ex. 11* | 1000 | Ambient | — | 1200 | Ambient | 36/80 | 1220 | Ambient |
| Ex. 12* | 1000 | Ambient | — | 1200 | Ambient | −350 | — | — |
| Ex. 13* | 1000 | Ambient | — | 1050 | 0 vol % | 36/80 | — | — |
| Ex. 14* | 1000 | Ambient | — | 1310 | 0 vol % | 36/80 | — | — |

*indicates Comparative Example.
Temp. = Temperature

TABLE 2

| | Chemical analysis (wt %) | | | | Characteristics of powder | | | | |
|---|---|---|---|---|---|---|---|---|---|
| | | | | | Proportion of particles with protrusions | Height of protrusion | Average plate diameter | Average thickness | Aspect |
| | Fe | Ni | Zn | Cu | (number %) | (μm) | (μm) | (μm) | ratio |
| Ex. 1 | 46.26 | 6.82 | 16.15 | 4.05 | 100 | 2 | 489 | 8 | 61.13 |
| Ex. 2 | 46.77 | 7.05 | 15.81 | 4.08 | 95 | 2 | 314 | 2.5 | 125.60 |
| Ex. 3 | 46.75 | 7.02 | 16.09 | 3.96 | 97 | 2.5 | 314 | 2.5 | 125.60 |
| Ex. 4 | 45.85 | 7.38 | 16.20 | 3.68 | 89 | 2 | 235 | 8 | 29.38 |
| Ex. 5 | 46.19 | 6.54 | 15.31 | 4.00 | 84 | 2 | 82 | 8 | 10.25 |
| Ex. 6 | 45.98 | 6.76 | 16.20 | 4.57 | 87 | 2 | 314 | 2.5 | 125.60 |
| Ex. 7 | 46.69 | 7.07 | 15.73 | 3.72 | 65 | 1 | 152 | 2.5 | 60.80 |
| Ex. 8 | 46.42 | 7.21 | 15.60 | 3.63 | 100 | 2.5 | 53 | 2.5 | 21.20 |
| Ex. 9 | 46.42 | 7.21 | 15.60 | 3.63 | 52 | 1.5 | 53 | 2.5 | 21.20 |
| Ex. 10* | 46.17 | 6.98 | 15.33 | 4.45 | 0 | 0 | 27 | 8 | 3.38 |
| Ex. 11* | 46.17 | 6.98 | 15.33 | 4.45 | 0 | 0 | 27 | 12 | 2.25 |
| Ex. 12* | 46.45 | 7.20 | 15.79 | 4.42 | 0 | 0 | 24.2 | 2.5 | 9.68 |
| Ex. 13* | 46.17 | 6.98 | 15.33 | 4.45 | 28 | 1 | 27 | 8 | 3.38 |
| Ex. 14* | — | — | — | — | — | — | — | — | — |

| | Characteristics of powder | Magnetic characteristics | | | Frequency characteristics | | Flexibility of resin molded |
|---|---|---|---|---|---|---|---|
| | SF-2 | σs (emu/g) | σr (emu/g) | Hc (Oe) | μ' | μ'' | article |
| Ex. 1 | 262 | 63.24 | 2.239 | 22.18 | 29 | 3 | A |
| Ex. 2 | 169 | 63.24 | 2.239 | 22.18 | 32 | 3 | A |
| Ex. 3 | 169 | 63.24 | 2.239 | 22.18 | 35 | 3 | A |
| Ex. 4 | 158 | 61.79 | 2.58 | 23.5 | 31 | 4 | A |
| Ex. 5 | 144 | 63.36 | 2.12 | 22.28 | 25 | 2 | A |
| Ex. 6 | 149 | 63.24 | 2.239 | 22.18 | 34 | 3 | A |
| Ex. 7 | 150 | 63.24 | 2.239 | 22.18 | 26 | 2 | A |
| Ex. 8 | 146 | 63.24 | 2.239 | 22.18 | 32 | 2 | A |
| Ex. 9 | 156 | 63.24 | 2.239 | 22.18 | 27 | 2 | A |
| Ex. 10* | 119 | 63.24 | 2.239 | 22.18 | 23 | 2 | B |
| Ex. 11* | 123 | 63.24 | 2.239 | 22.18 | 23 | 2 | C |
| Ex. 12* | 127 | 63.24 | 2.239 | 22.18 | 8 | 1 | B |
| Ex. 13* | 124 | 63.24 | 2.239 | 22.18 | 19 | 4 | B |
| Ex. 14* | — | — | — | — | — | — | — |

*indicates Comparative Example.

The invention claimed is:

1. A powdered ferrite comprising platy ferrite particles having a spinel crystal structure,
wherein the powdered ferrite comprises at least 50 number % platy ferrite particles each having at least one protrusion on a surface of the particle, and the at least one protrusion has a shape selected from the group consisting of a rectangular pyramid, a truncated rectangular pyramid, an elongated rectangular pyramid, and combinations thereof.

2. The powdered ferrite according to claim 1, wherein the height of the protrusion is smaller than the thickness of the platy ferrite particle.

3. The powdered ferrite according to claim 1, wherein the platy ferrite particles have an average plate diameter of 10 to 2000 μm.

4. The powdered ferrite according to claim 1, wherein the platy ferrite particles have an average thickness of 0.5 to 100 μm.

5. The powdered ferrite according to claim 1, wherein the platy ferrite particles have an aspect ratio of 4 to 1000.

6. The powdered ferrite according to claim 1, wherein the platy ferrite particles have indefinite shapes.

7. The powdered ferrite according to claim 6, wherein the platy ferrite particles have a shape factor SF-2 of 135 to 300.

8. The powdered ferrite according to claim 1, wherein the platy ferrite particles comprise Ni—Zn ferrite or Ni—Zn—Cu ferrite.

9. A resin composition, comprising the powdered ferrite according to claim 1 and a resin.

10. An electronic circuit board, electronic circuit component, or housing for electronic devices, comprising the resin composition according to claim 9, wherein the electronic circuit board, electronic circuit component, or housing for electronic devices has an electromagnetic shielding effect.

11. An electromagnetic shielding material, comprising the powdered ferrite according to claim 1 as a filler.

12. The electromagnetic shielding material according to claim 11, wherein the electromagnetic shielding material has flexibility, and is bondable to a base body having a curved surface.

13. An electronic circuit board, electronic circuit component, or housing for electronic devices, comprising the electromagnetic shielding material according to claim 11, wherein the electronic circuit board, electronic circuit component, or housing for electronic devices has an electromagnetic shielding effect.

14. An electronic circuit board, electronic circuit component, or housing for electronic devices, comprising the powdered ferrite according to claim 1, wherein the electronic circuit board, electronic circuit component, or housing for electronic devices has an electromagnetic shielding effect.

\* \* \* \* \*